United States Patent
Jang et al.

(10) Patent No.: US 9,481,929 B2
(45) Date of Patent: Nov. 1, 2016

(54) VAPOR DEPOSITION APPARATUS, VAPOR DEPOSITION METHOD AND METHOD OF MANUFACTURING ORGANIC LIGHT EMITTING DISPLAY APPARATUS

(71) Applicant: Samsung Display Co., Ltd., Yongin, Gyeonggi-Do (KR)

(72) Inventors: Choel-Min Jang, Yongin (KR); Sung-Hun Key, Yongin (KR); In-Kyo Kim, Yongin (KR); Suk-Won Jung, Yongin (KR); Myung-Soo Huh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 257 days.

(21) Appl. No.: 14/177,180

(22) Filed: Feb. 10, 2014

(65) Prior Publication Data

US 2015/0072453 A1      Mar. 12, 2015

(30) Foreign Application Priority Data

Sep. 10, 2013  (KR) .......................... 10-2013-0108620

(51) Int. Cl.
*H01L 21/36* (2006.01)
*C23C 16/455* (2006.01)

(52) U.S. Cl.
CPC .............................. *C23C 16/45551* (2013.01)

(58) Field of Classification Search
CPC ................... H01L 21/67207; H01L 51/0002; C23C 16/45525; C23C 16/45551; C23C 16/45563
USPC ........................................ 438/503, 507, 778
See application file for complete search history.

(56) References Cited

U.S. PATENT DOCUMENTS

| | | | |
|---|---|---|---|
| 5,963,834 A * | 10/1999 | Hatano | C23C 16/4405 438/680 |
| 6,796,316 B2 * | 9/2004 | Park | C23C 16/4405 134/2 |
| 8,092,606 B2 | 1/2012 | Park et al. | |
| 8,182,608 B2 | 5/2012 | Kerr et al. | |
| 2007/0238311 A1 | 10/2007 | Levy | |
| 2010/0068413 A1 | 3/2010 | Lee | |

(Continued)

FOREIGN PATENT DOCUMENTS

| JP | 64-011319 | 1/1989 |
|---|---|---|
| JP | 2011-101064 | 5/2011 |

(Continued)

OTHER PUBLICATIONS

KIPO Office action dated Dec. 29, 2014, for Korean priority Patent application 10-2013-0108620, (6 pages).

(Continued)

*Primary Examiner* — Kevin M Picardat
(74) *Attorney, Agent, or Firm* — Lewis Roca Rothgerber Christie LLP

(57) ABSTRACT

A vapor deposition apparatus for depositing thin films on a substrate includes a supply unit including a plurality of linear supply members configured to supply at least one gas; and a nozzle unit including a plurality of nozzle members connected to the plurality of supply members and configured to supply the at least one gas toward the substrate, wherein two adjacent nozzle members of the plurality of nozzle members are connected to at least one common supply member of the plurality of supply members.

23 Claims, 11 Drawing Sheets

(56) References Cited

U.S. PATENT DOCUMENTS

| | | |
|---|---|---|
| 2010/0310771 A1 | 12/2010 | Lee |
| 2012/0225192 A1 | 9/2012 | Yudovsky et al. |
| 2014/0024180 A1* | 1/2014 | Choi .................. H01L 21/02107 438/127 |

FOREIGN PATENT DOCUMENTS

| | | |
|---|---|---|
| KR | 10-2004-0082177 A | 9/2004 |
| KR | 10-2008-0046344 | 5/2008 |
| KR | 10-2008-0109002 A | 12/2008 |
| KR | 10-2010-0020920 | 2/2010 |
| KR | 10-2010-0032315 A | 3/2010 |
| KR | 10-2012-0027399 A | 3/2012 |
| WO | WO 2010/019007 A2 | 2/2010 |
| WO | WO 2012/118946 A2 | 9/2012 |

OTHER PUBLICATIONS

KIPO Office action dated Oct. 14, 2015, for Korean priority Patent application 10-2013-0108620, (6 pages).

KIPO Office Action dated Jul. 13, 2016, for corresponding Korean Patent Application No. 10-2016-0066754 (5 pages).

\* cited by examiner

VAPOR DEPOSITION APPARATUS, VAPOR DEPOSITION METHOD AND METHOD OF MANUFACTURING ORGANIC LIGHT EMITTING DISPLAY APPARATUS

CROSS-REFERENCE TO RELATED APPLICATION

This application claims priority to and the benefit of Korean Patent Application No. 10-2013-0108620, filed on Sep. 10, 2013, in the Korean Intellectual Property Office, the disclosure of which is incorporated herein in its entirety by reference.

BACKGROUND

1. Field

Aspects of one or more embodiments of the present invention relate to a vapor deposition apparatus, a vapor deposition method, and a method of manufacturing an organic light emitting display apparatus.

2. Description of the Related Art

Semiconductor devices, display apparatuses, and electronic devices include a plurality of thin films. One of various methods of forming the plurality of thin films is a vapor deposition method.

The vapor deposition method uses one or more gases as a raw material for forming thin films. Such a vapor deposition method may include a chemical vapor deposition (CVD) method, an atomic layer deposition (ALD) method, and other various suitable methods.

According to the ALD method, one raw material is injected, purged, and pumped, and one or more molecular layers are adsorbed or deposited onto a substrate. Also, another kind of raw material may be injected and purged/pumped to finally form one or more desired atomic layers.

Among display apparatuses, an organic light-emitting display apparatus has wide viewing angles, high contrast, and fast response speeds and thus has received attention as a next generation display apparatus.

The organic light-emitting display apparatus includes an intermediate layer between opposite first and second electrodes and one or more various kinds of thin films, and the intermediate layer includes an organic emission layer. Here, a deposition process is used to form the thin films of the organic light-emitting display apparatus.

Research has been conducted in order to improve efficiency in a vapor deposition processes and to improve thin film property in order to form various thin films.

SUMMARY

Aspects of one or more embodiments of the present invention are directed toward a vapor deposition apparatus, a vapor deposition method, and a method of manufacturing an organic light emitting display apparatus.

Additional aspects and characteristics will be set forth in part in the description which follows and, in part, will be apparent from the description, or may be learned by practice of the presented embodiments.

According to one or more embodiments of the present invention, a vapor deposition apparatus for depositing thin films on a substrate includes a supply unit including a plurality of linear supply members configured to supply at least one gas; and a nozzle unit including a plurality of nozzle members connected to the plurality of supply members and configured to supply the at least one gas toward the substrate, wherein two adjacent nozzle members of the plurality of nozzle members may be connected to at least one common supply member of the plurality of supply members.

The plurality of nozzle members of the nozzle unit may be elongated along a direction parallel to a direction along which the supply members extend.

The plurality of supply members may include first supply members, selectively supplying a purge gas and a first raw material gas, and second supply members, selectively supplying the purge gas and a second raw material gas.

The first supply members, selectively supplying the purge gas and the first raw material gas, and the second supply members, selectively supplying the purge gas and the second raw material gas, may be alternately located.

When the first supply members, selectively supplying the purge gas and the first raw material gas, supply the first raw material gas, the second supply members, selectively supplying the purge gas and the second raw material gas, may supply the purge gas.

When the second supply members, selectively supplying the purge gas and the second raw material gas, supply the second raw material gas, the first supply members, selectively supplying the purge gas and the first raw material gas, may supply the purge gas.

Two adjacent supply members of the plurality of supply members may be connected to at least one common nozzle member of the plurality of nozzle members.

According to one or more embodiments of the present invention, a vapor deposition method includes preparing a substrate; supplying a gas to a supply unit, wherein the gas is supplied to one end portion of each of a plurality of linear supply members of the supply unit; transferring the gas supplied to the supply unit to a nozzle unit including a plurality of nozzle members; and providing the gas toward the substrate via the nozzle members, wherein two adjacent nozzle members of the plurality of nozzle members may be arranged so as to be connected to at least one common supply member of the plurality of supply members.

The plurality of nozzle members of the nozzle unit may be elongated along a direction parallel to a direction along which the supply members extend.

The plurality of supply members may include first supply members, selectively supplying a purge gas and a first raw material gas, and second supply members, selectively supplying the purge gas and a second raw material gas.

The first supply members, selectively supplying the purge gas and the first raw material gas, and the second supply members, selectively supplying the purge gas and the second raw material gas, may be alternately located.

When the first supply members, selectively supplying the purge gas and the first raw material gas, supply the first raw material gas, the second supply members, selectively supplying the purge gas and the second raw material gas, may supply the purge gas.

When the second supply members, selectively supplying the purge gas and the second raw material gas, supply the second raw material gas, the first supply members, selectively supplying the purge gas and the first raw material gas, may supply the purge gas.

Two adjacent supply members of the plurality of supply members may be connected to at least one common nozzle member of the plurality of nozzle members.

An exhaust unit may be connected to an other end portion facing the one end portion of each of the plurality of linear supply members.

The vapor deposition method may include an atomic layer deposition (ALD) method.

According to one or more embodiments of the present invention, a method of manufacturing an organic light emitting display apparatus including one or more thin films on a substrate, the method includes processes of forming the one or more thin films on the substrate and includes preparing a substrate; supplying a gas to a supply unit, wherein the gas is supplied to one end portion of each of a plurality of linear supply members of the supply unit; transferring the gas supplied to the supply unit to a nozzle unit including a plurality of nozzle members; and providing the gas toward the substrate via the nozzle members, wherein two adjacent nozzle members of the plurality of nozzle members are arranged so as to be connected to at least one common supply member of the plurality of supply members.

The organic light emitting display apparatus may include an organic light emitting device (OLED) including a first electrode, a second electrode, and an intermediate layer between the first electrode and the second electrode, the intermediate layer including at least an organic emission layer, and wherein the forming the one or more thin films on the substrate may further include forming an encapsulation layer on the OLED.

The forming the one or more thin films on the substrate may further include forming one or more insulating layers in the organic light emitting display apparatus.

The forming the one or more thin films on the substrate may include forming one or more conductive layers in the organic light emitting display apparatus.

BRIEF DESCRIPTION OF THE DRAWINGS

These and/or other aspects and characteristics will become apparent and more readily appreciated from the following description of the embodiments, taken in conjunction with the accompanying drawings in which.

DETAILED DESCRIPTION

Figure 1:
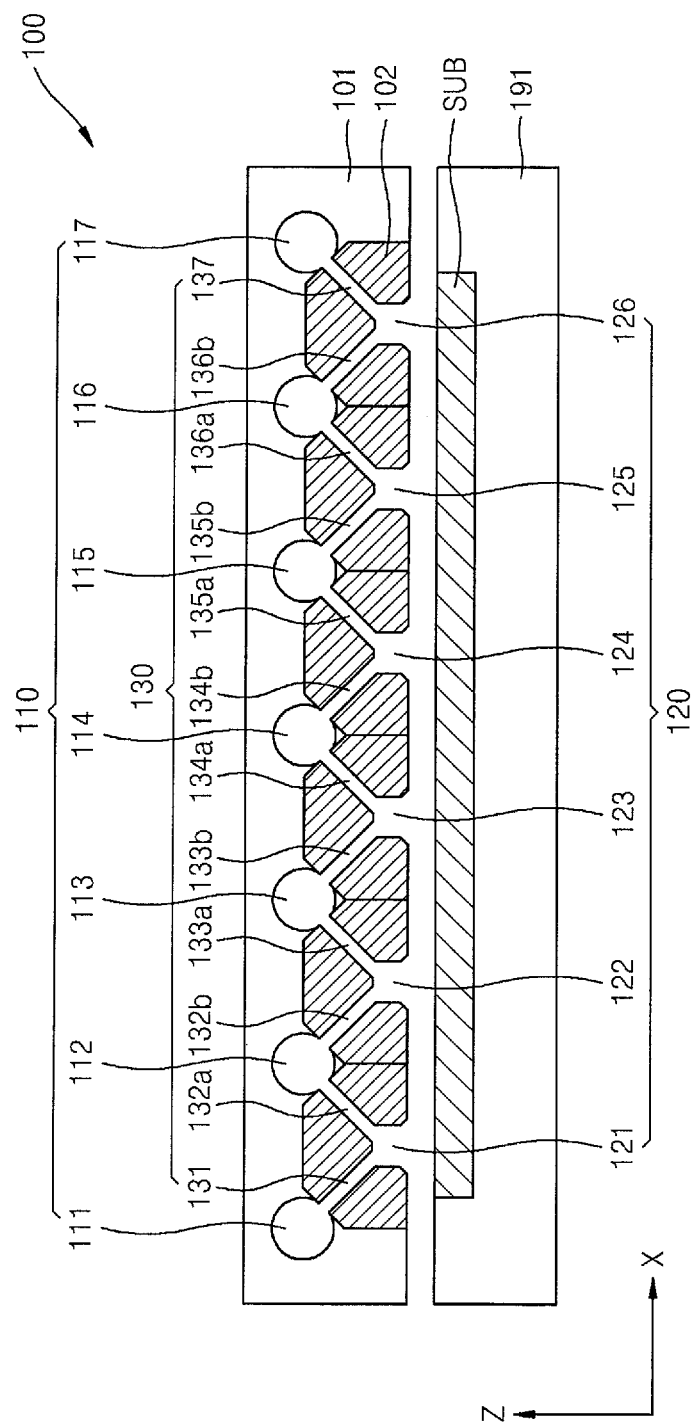
FIG. 1 is a cross-sectional view of a vapor deposition apparatus according to an embodiment of the present invention.

Reference will now be made in detail to example embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. Expressions, such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a," "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings may be arbitrarily illustrated for convenience of explanation, the following embodiments are not limited thereto.

In the following examples, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When a certain embodiment may be implemented differently, a specific process order thereof may be performed differently from the described order. For example, two consecutively described processes may be performed at substantially the same time or may be performed in an order opposite to the described order. Further, the use of "may" when describing embodiments of the present invention refers to "one or more embodiments of the present invention."

Figure 2:
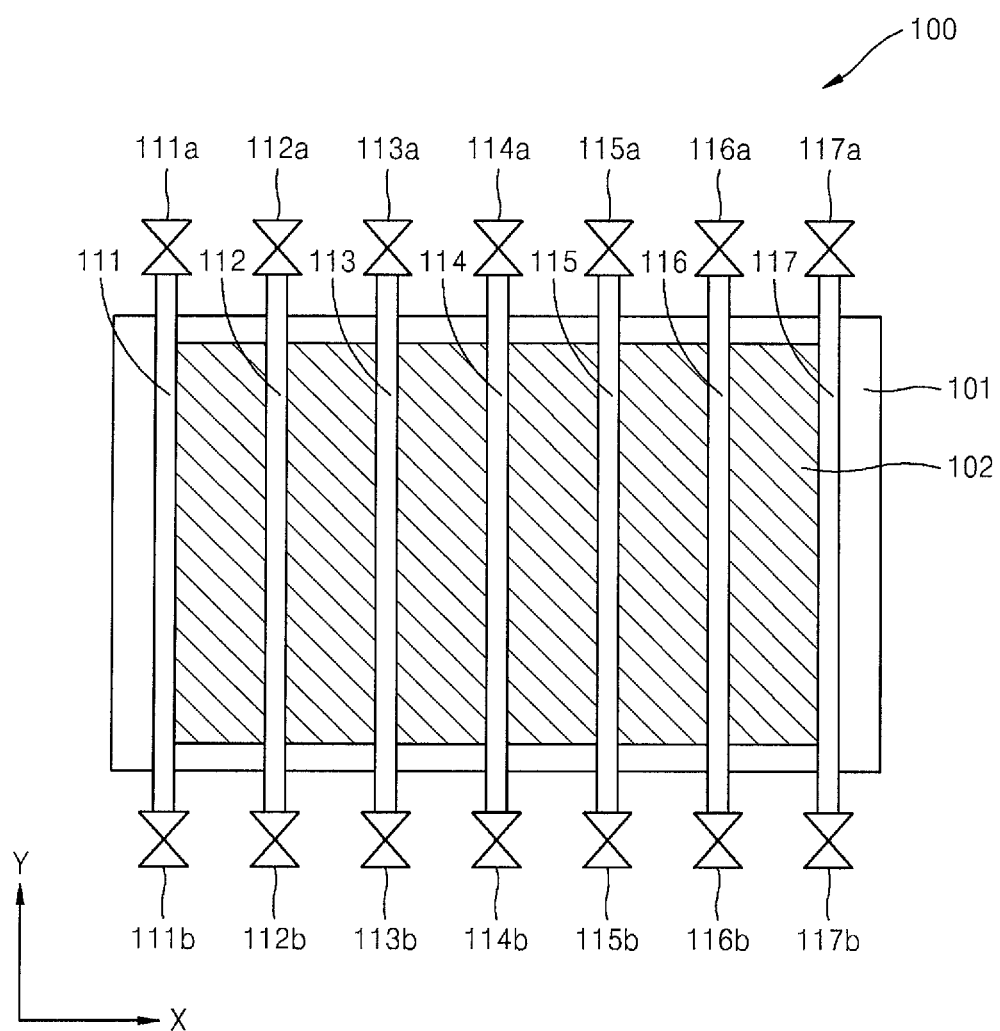
FIG. 2 is a plan view of the vapor deposition apparatus illustrated in FIG. 1.

FIG. 1 is a schematic cross-sectional view of a vapor deposition apparatus according to an embodiment of the present invention, and FIG. 2 is a plan view of the vapor deposition apparatus shown in FIG. 1.

Referring to FIGS. 1 and 2, the vapor deposition apparatus 100 includes a supply unit 110, a nozzle unit 120, housings 101 and 102, and a stage 191.

The vapor deposition apparatus 100 performs a vapor deposition process on a substrate SUB to form one or more thin films on the substrate SUB.

The substrate SUB is disposed on the stage 191. The stage 191 supports (e.g., fixedly supports) the substrate SUB during the vapor deposition processes. To do this, a clamp may be disposed on the stage 191. In addition, as shown in FIG. 1, the stage 191 may be formed to have a groove in which the substrate SUB is arranged. As such, the substrate SUB may be stably disposed on the stage 191, and the substrate SUB falling from the stage 191 or vibration of the substrate SUB during the vapor deposition processes may be reduced or prevented. However, the embodiments of the present invention are not limited thereto, that is, the stage 191 may not include the groove.

In an other embodiment of the present invention, heat may be applied to the stage 191 (e.g., the stage 191 may be heated) in order to improve efficiency of the vapor deposition processes.

The supply unit 110 may include a plurality of supply members 111 to 117. For example, the supply unit 110 may include a first supply member 111, a second supply member, a third supply member 113, a fourth supply member 114, a fifth supply member 115, a sixth supply member 116, and a seventh supply member 117. In the present embodiment, the supply unit 110 includes seven supply members; however, the embodiments of the present invention are not limited thereto, and the number of supply members included in the supply unit 110 may be more or less than seven.

The plurality of supply members 111 through 117 of the supply unit 110 may have elongated linear shapes. In addition, each of the supply members 111 through 117 may include an end portion and an other end portion. That is, as shown in FIG. 2, the first supply member 111 includes an end portion 111a and an other end portion 111b facing the end portion 111a, the second supply member 112 includes an end portion 112a and an other end portion 112b facing the end portion 112a, the third supply member 113 includes an end portion 113a and an other end portion 113b facing the end portion 113a, the fourth supply member 114 includes an end portion 114a and an other end portion 114b facing the end portion 114a, the fifth supply member 115 includes an end portion 115a and an other end portion 115b facing the end portion 115a, the sixth supply member 116 includes an end portion 116a and an other end portion 116b facing the end portion 116a, and the seventh supply member 117 includes an end portion 117a and an other end portion 117b facing the end portion 117a.

The end portions 111a through 117a of the respective supply members 111 through 117 may be connected to (or coupled to) a gas supply apparatus to receive (e.g., configured to receive) one or more gases, and an exhaust unit may be connected to the other end portions 111b through 117b. For example, the other end portions 111b through 117b may be connected to a pump.

The gas supplied to the end portions 111a through 117a of the respective supply members 111 through 117 may be transferred to the nozzle unit 120 that will be described later, and the gas used during the deposition processes may be easily exhausted through the other end portions 111b through 117b, thereby improving the efficiency of the deposition processes. Because the gas used in the deposition processes is easily exhausted through the other end portions 111b through 117b, there may be little or no remaining gas in the plurality of supply members 111 through 117 when a gas that will be used in post-processes is injected through the end portions 111a through 117a. Thus, interference between the different gases that are used in different processes may be reduced or prevented.

The plurality of supply members 111 through 117 are disposed to correspond to an area (e.g., an entire area) of the substrate SUB and may be arranged at intervals (e.g., constant intervals) therebetween.

The nozzle unit 120 is disposed to face the substrate SUB and is closer to the substrate SUB than the supply unit 110 is. The nozzle unit 120 may include a plurality of nozzle members 121 through 126. For example, the nozzle unit 120 may include a first nozzle member 121, a second nozzle member 122, a third nozzle member 123, a fourth nozzle member 124, a fifth nozzle member 125, and a sixth nozzle member 126.

The gas transferred from the plurality of supply members 111 through 117 of the supply unit 110 to the plurality of nozzle members 121 through 126 of the nozzle unit 120 is provided to the substrate SUB via the nozzle members 121 through 126.

The nozzle members 121 through 126 of the nozzle unit 120 may have elongated linear shapes, similar to the supply members 111 through 117 of the supply unit 110. Here, the extending direction of the plurality of nozzle members 121 through 126 may be parallel to the extending direction of the supply members 111 through 117.

The plurality of nozzle members 121 through 126 will be described in more detail. The first nozzle member 121 is disposed between the first supply member 111 and the second supply member 112. The second nozzle member 122 is disposed between the second supply member 112 and the third supply member 113 so as to be separated from the first nozzle member 121. The third nozzle member 123 is disposed between the third supply member 113 and the fourth supply member 114 so as to be separated from the second nozzle member 122. The fourth nozzle member 124 is disposed between the fourth supply member 114 and the fifth supply member 115 to be separated from the third nozzle member 123. The fifth nozzle member 125 is disposed between the fifth supply member 115 and the sixth supply member 116 to be separated from the fourth nozzle member 124. The sixth nozzle member 126 is disposed between the sixth supply member 116 and the seventh supply member 117 to be separated from the fifth nozzle member 125.

A connection unit 130 may be disposed between the supply unit 110 and the nozzle unit 120 and may include a plurality of connection members 131 through 137. The plurality of supply members 111 through 117 and the plurality of nozzle members 121 through 126 may be connected to each other via the plurality of connection members 131 through 137. That is, the plurality of connection members 131 through 137 may be formed as hollow passages.

The plurality of connection members 131 through 137 will be described below.

The first connection member 131 connects the first supply member 111 and the first nozzle member 121 to each other.

A second connection member A 132a connects the second supply member 112 and the first nozzle member 121 to each other, and a second connection member B 132b connects the second supply member 112 and the second nozzle member 122 to each other.

A third connection member A 133a connects the third supply member 113 and the second nozzle member 122 to each other, and a third connection member B 133b connects the third supply member 113 and the third nozzle member 123 to each other.

A fourth connection member A 134a connects the fourth supply member 114 and the third nozzle member 123 to each other, and a fourth connection member B 134b connects the fourth supply member 114 and the fourth nozzle member 124 to each other.

A fifth connection member A 135a connects the fifth supply member 115 and the fourth nozzle member 124 to each other, and a fifth connection member B 135b connects the fifth supply member 115 and the fifth nozzle member 125 to each other.

A sixth connection member A 136a connects the sixth supply member 116 and the fifth nozzle member 125 to each other, and a sixth connection member B 136b connects the sixth supply member 116 and the sixth nozzle member 126 to each other.

The seventh connection member 137 connects the seventh supply member 117 and the sixth nozzle member 126 to each other.

The second through sixth supply members 112 through 116 of the supply unit 110, that is, the supply members other than the first and seventh supply members 111 and 117 at opposite sides, are respectively connected to two connection members 132a and 132b, 133a and 133b, 134a and 134b, 135a and 135b, and 136a and 136b that are disposed at opposite sides based on the supply members 112 through 116. For example, the second supply member 112 is connected to two connection members 132a and 132b that are disposed at opposite sides to be apart from each other.

As such, the supply members 112 through 116 are each connected to two nozzle members. For example, the second supply member 112 is connected to the first nozzle member 121 and the second nozzle member 122. Because the two nozzle members are connected to one common supply member, deposition processes having a uniform gas supply onto the substrate SUB may be performed by using (or utilizing) a reduced number of supply members.

Also, each of the plurality of nozzle members 121 through 126 of the nozzle unit 120 may receive the gas from two adjacent supply members. For example, the first nozzle member 121 is connected to both the first supply member 111 and the second supply member 112 to receive the gas therefrom. Because one nozzle member may receive the gas from the two supply members, the gas may stably be provided from the one nozzle member to the substrate SUB. Also, if the two supply members provide different gases from each other, it may be easy for a plurality of gases to be provided (e.g., selectively provided) from the one nozzle member to the substrate SUB.

The housings 101 and 102 include a first housing 101 and a second housing 102. The first housing 101 is disposed on the outside of the second housing 102. Also, a space (e.g., a predetermined space) may be formed in the second housing 102 to define the nozzle unit 120 and the connection unit 130 connected to the nozzle unit 120. That is, the nozzle unit 120 and the connection unit 130 may be protected by the second housing 102.

The supply unit 110 is formed between the first housing 101 and the second housing 102. That is, a space (e.g., a predetermined space) may be formed between the first housing 101 and the second housing 102 to define the supply unit 110. Here, the first housing 101 may include a space having a curved surface at a surface thereof corresponding to the second housing 102 such that an inner surface of the supply unit 110 may have a curved surface.

FIGS. 3A through 3E are diagrams illustrating example deposition processes performed using (or utilizing) the vapor deposition apparatus 100 illustrated in FIG. 1. However, vapor deposition apparatuses that will be described later with reference to FIGS. 4, 5, and 6 may also be applied.

Figure 3A:
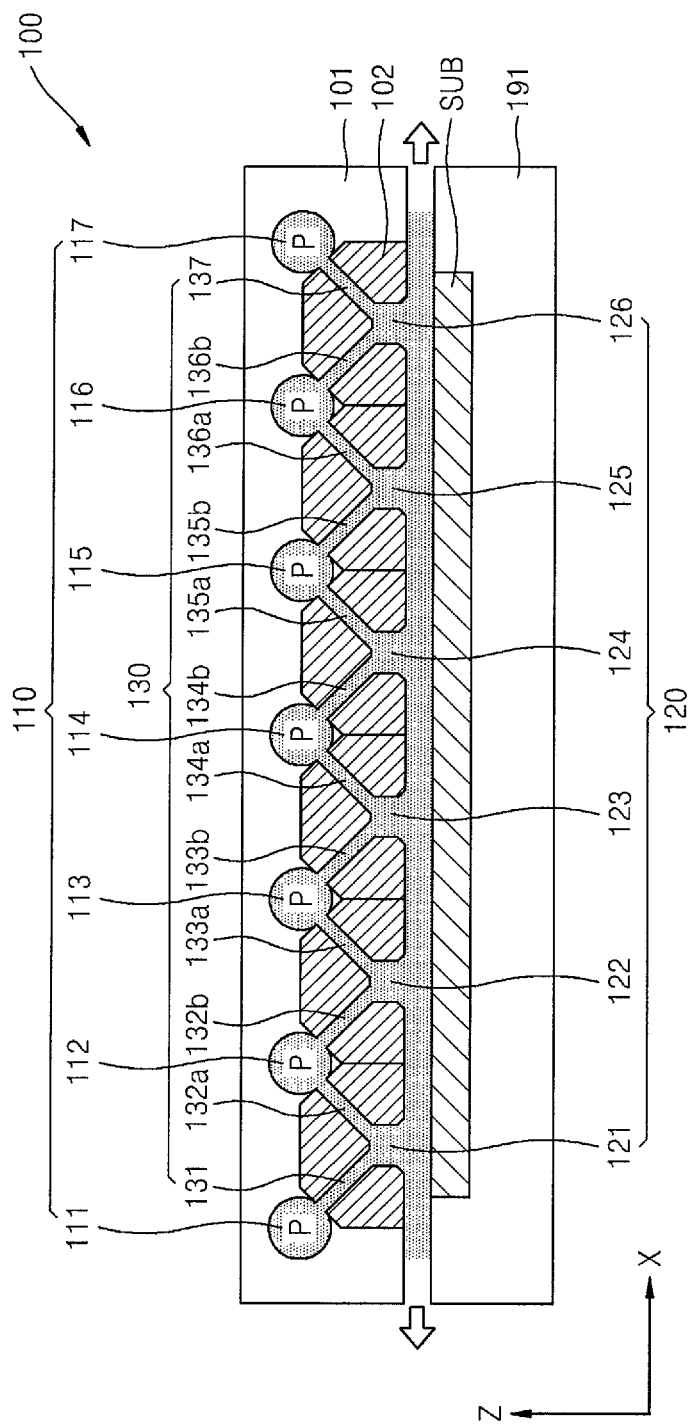
FIGS. 3A through 3E are diagrams illustrating deposition processes performed by the vapor deposition apparatus illustrated in FIG. 1.

Referring to FIG. 3A, a purge gas P is provided from the plurality of supply members 111 through 117 of the supply unit 110 to the substrate SUB via the plurality of nozzle members 121 through 126 of the nozzle unit 120. The purge gas P may include various materials, for example, an inert gas, argon (Ar), or nitrogen (N) gas. Impurities on the substrate SUB are removed by using the purging gas P, and cleanness in the space in which the vapor deposition processes will be performed is maintained by using the purge gas P. Here, the purge gas P is exhausted to the outside of the substrate SUB and the plurality of nozzle members 121 through 126 in a direction denoted by arrows. Thus, when the process using the purge gas P is finished, the purge gas P is easily removed such that it does not remain on the substrate SUB.

Figure 3B:
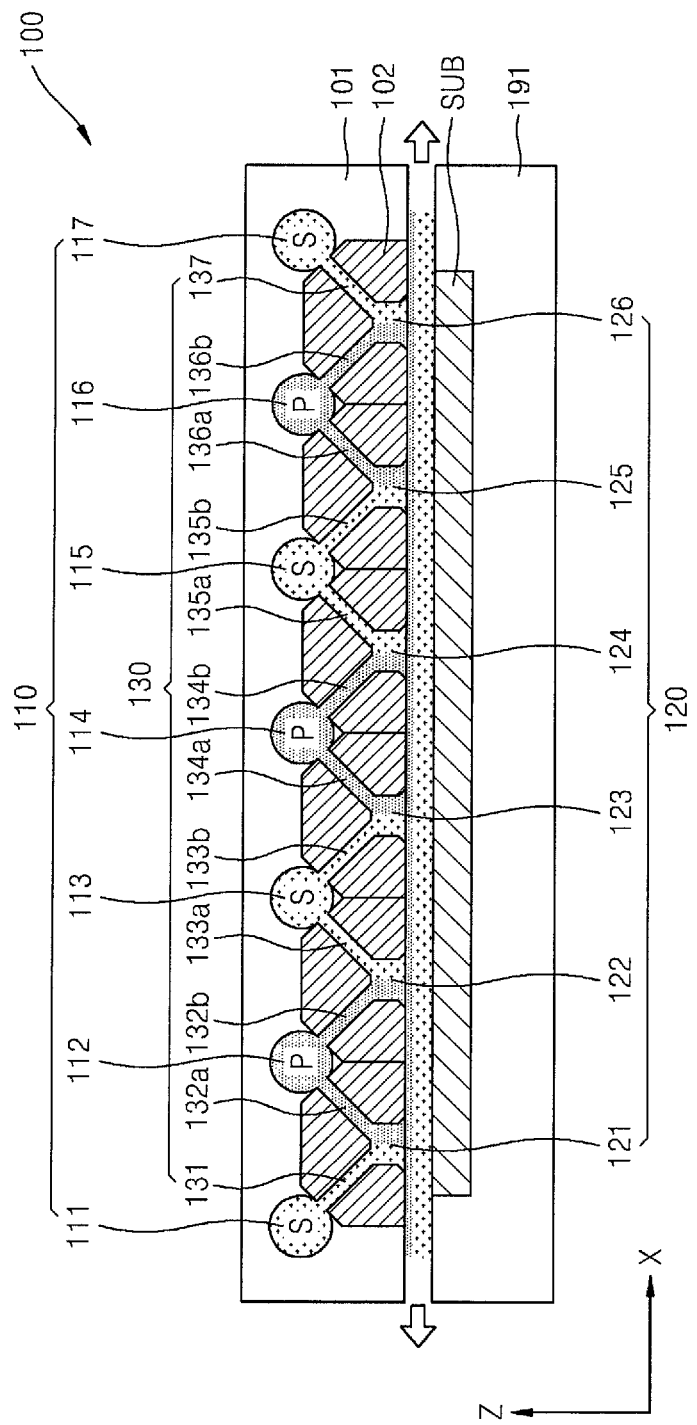

After that, referring to FIG. 3B, a first raw material gas S is supplied to the substrate SUB from the first supply member 111, the third supply member 113, the fifth supply member 115, and the seventh supply member 117 of the supply unit 110 via the plurality of nozzle members 121 through 126 of the nozzle member 120. At the same time, the purge gas P is provided from the second supply member 112, the fourth supply member 114, and the sixth supply member 116 of the supply unit 110 to the substrate SUB via the nozzle members 121 through 126 of the nozzle unit 120. That is, a gas in which the first raw material gas S and the purge gas P are mixed is provided to the substrate SUB via the plurality of nozzle members 121 through 126.

The first raw material gas S may include various suitable materials, for example, a gas including aluminum (Al), for example, trimethyl aluminum (TMA). In this case, when the first raw material gas S is injected toward the substrate SUB, an adsorption layer including Al is formed on the surface of the substrate SUB. For example, a chemical adsorption layer and a physical adsorption layer are formed on the surface of the substrate SUB.

Here, the purge gas P and the first raw material gas S are exhausted to the outside of the substrate SUB and the plurality of nozzle members 121 through 126 in the directions denoted by arrows, and thus, the purge gas P and the first raw material gas S are easily removed such that it does not remain on the substrate SUB.

As described above, each of the plurality of supply members 111 through 117 of the supply unit 110 includes an end portion and an other end portion, the gas may be supplied from the end portion, and the exhaust unit may be connected to the other end portion. The used gas may be easily removed by the exhaust unit. That is, as shown in FIGS. 3A and 3B, the first, third, fifth, and seventh supply members 111, 113, 115, and 117 each supplies (e.g., sequentially supplies) the purge gas P and then the first raw material gas S to the plurality of nozzle members 121 through 126. Here, the supplied gas may be rapidly changed, and the remaining gas may be easily removed by using the exhaust unit connected to the other end portions of the first, third, fifth, and seventh supply members 111, 113, 115, and 117.

Figure 3C:
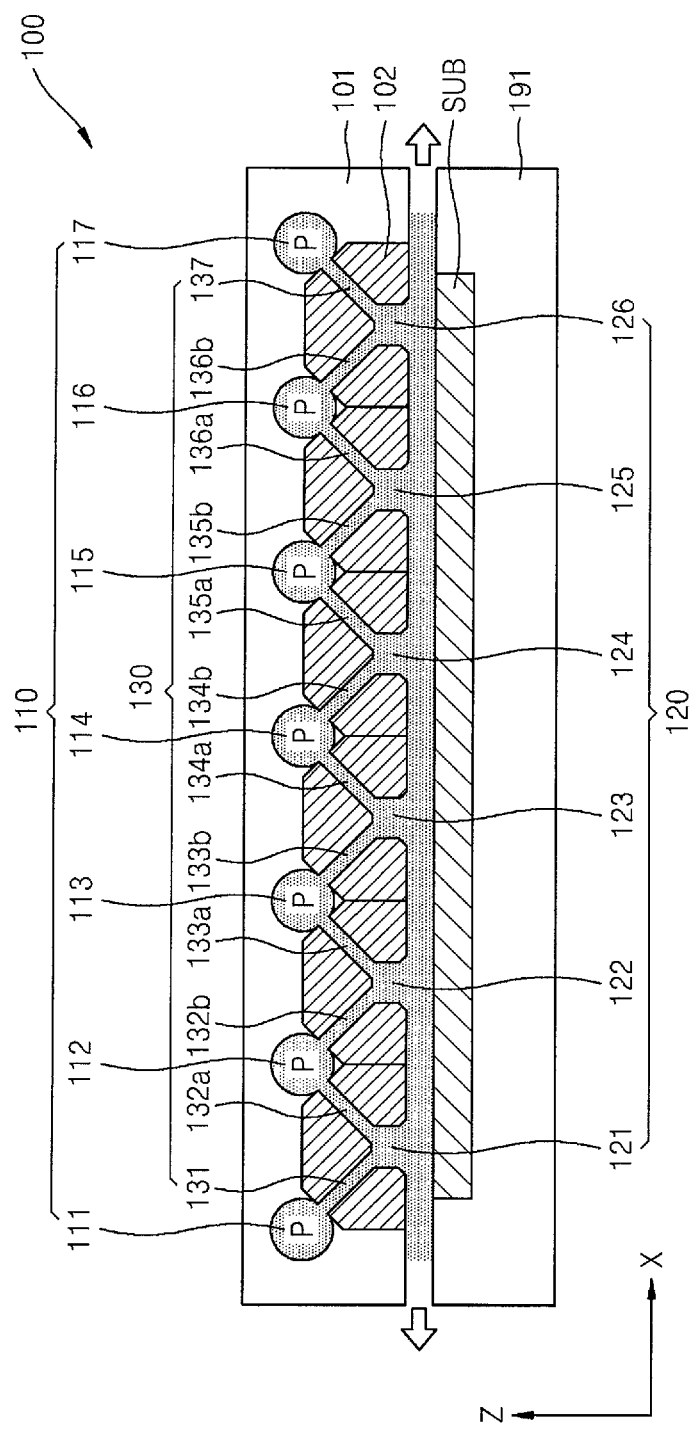

After that, referring to FIG. 3C, the purge gas P may be supplied from the plurality of supply members 111 through 117 of the supply unit 110 toward the substrate SUB via the nozzle members 121 through 126 of the nozzle unit 120. The physical adsorption layer, which has a weak bonding force between molecules and is formed by the first raw material gas S on the surface of the substrate SUB, may be isolated from the substrate SUB by the purge gas P, and the isolated material or residue thereof may be exhausted in the direction denoted by the arrows to the outside of the substrate SUB and the plurality of nozzle members 121 through 126, thereby improving purity of deposition layers.

Figure 3D:
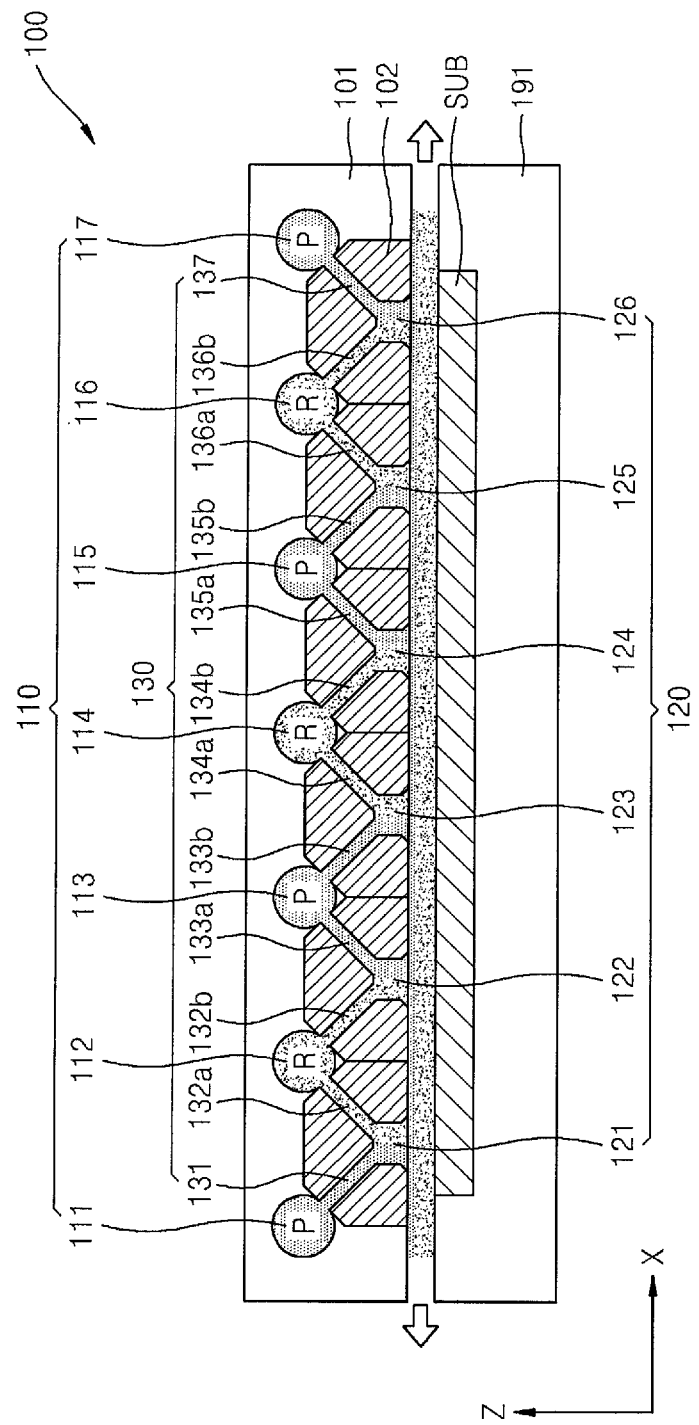

Then, referring to FIG. 3D, a second raw material gas R may be supplied from the second supply member 112, the fourth supply member 114, and the sixth supply member 116 of the supply unit 110 toward the substrate SUB via the plurality of nozzle members 121 through 126. Also, at the same time, the purge gas P may be supplied from the first, third, fifth, and seventh supply members 111, 113, 115, and 117 of the supply unit 110 to the substrate SUB via the nozzle members 121 through 126 of the nozzle unit 120. That is, a gas in which the second raw material gas R and the purge gas P are mixed may be supplied to the substrate SUB via the plurality of nozzle members 121 through 126.

The second raw material gas R may include various gases, for example, the second raw material gas R may be a gas including oxygen, for example, water vapor (e.g., $H_2O$), oxygen (e.g., $O_2$), or nitrous oxide (e.g., $N_2O$).

When the second raw material gas R is supplied to the substrate SUB, the second raw material gas R reacts with the chemical adsorption layer formed of the first raw material gas S or substitutes for a gas which forms a part of the chemical adsorption layer, and a desired deposition layer, for example, aluminum oxide (e.g., $Al_xO_y$), may be finally formed. Here, second raw material gas R either remains on the substrate SUB or is exhausted to the outside of the substrate SUB and the plurality of nozzle members 121 through 126 after forming a physical adsorption layer. The remaining second raw material gas R is exhausted to the outside of the substrate SUB and the plurality of nozzle members 121 through 126 in the direction denoted by arrows.

As described above, each of the plurality of supply members 111 through 117 in the supply unit 110 may include an end portion and an other end portion, and the gas may be supplied from the end portion and the exhaust unit may be connected to the other end portion. The used gas may be easily removed by the exhaust unit. For example, as shown in FIGS. 3C and 3D, the second, fourth, and sixth supply members 112, 114, and 116 each supplies (e.g., sequentially supplies) the purge gas P and then the second raw material gas R to the plurality of nozzle members 121 to 126. Here, the supplied gas may be rapidly changed, and the remaining gas may be easily removed by using the exhaust unit connected to the other end portions of the second, fourth, and sixth supply members 112, 114, and 116.

Also, the purge gas P may be supplied through the first, third, fifth, and seventh supply members 111, 113, 115, and 117, through which the first raw material gas S has been supplied (e.g., previously supplied), in order to prevent contamination due to the second raw material gas R.

Figure 3E:
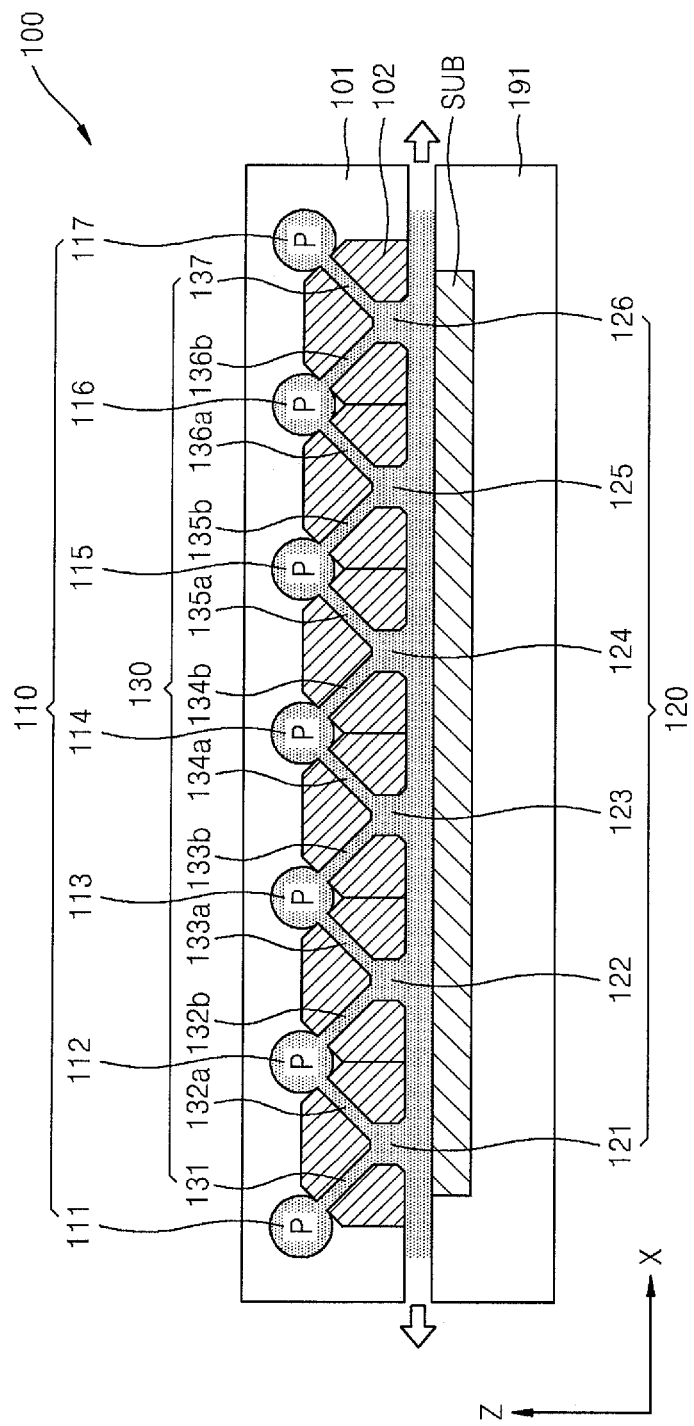

After that, referring to FIG. 3E, the purge gas P may be supplied from the plurality of supply members 111 through 117 of the supply member 110 toward the substrate SUB via the plurality of nozzle members 121 through 126 of the nozzle unit 120. The physical adsorption layer remaining on the surface of the substrate SUB is isolated from the substrate SUB by using the purge gas P. The isolated material or residue may be exhausted to the outside of both the substrate SUB and the plurality of nozzle members 121 through 126 in the direction denoted by the arrow, thereby improving purity of the deposition layer.

In the present embodiment, the kinds of the first raw material gas S and the second raw material gas R used and the thin film (e.g., $Al_xO_y$ thin film) formed by using the gases are provided as an example, and the present invention is not thereby limited. For example, various other kinds of first and second raw material gases S and R may be used, thereby forming various thin films.

According to the present embodiment, the plurality of nozzle members 121 through 126 are connected to the plurality of supply members 111 through 117 so as to provide one or more raw material gases and the purge gas to the substrate SUB. Thus, in this example embodiment, there is no need to move the substrate SUB during the deposition process including a plurality of processes. In addition, the vapor deposition apparatus 100 may be small in size.

For example, because the first raw material gas S, the second raw material gas R, and the purge gas P are injected (e.g., sequentially injected) from the nozzle members 121 through 126, the ALD process, one cycle of which includes a plurality of processing stages, may be easily performed.

Here, the remaining gas and the residue may be exhausted to the outside of the substrate SUB in or during each of the processes, and thereby improving the purity of the deposition layer.

Also, the plurality of supply members 111 through 117 are formed, and the plurality of supply members 111 through 117 supply (e.g., selectively supply) the first raw material gas S, the second raw material gas R, and the purge gas P to the substrate SUB. Because the first raw material gas S and the second raw material gas R may be supplied respectively through the first, third, fifth, and seventh supply members 111, 113, 115, and 117, and the second, fourth, and sixth supply members 112, 114, and 116, the contamination of the first, third, fifth, and seventh supply members 111, 113, 115, and 117 and the second, fourth, and sixth supply members 112, 114, and 116 may be prevented. For example, while the first raw material gas S is supplied through the first, third, fifth, and seventh supply members 111, 113, 115, and 117, the purge gas P may be supplied through the second, fourth, and sixth supply members 112, 114, and 116 so as to prevent the second, fourth, and sixth supply members 112, 114, and 116 from being contaminated by the first raw material gas S. Also, while the second raw material gas R is supplied through the second, fourth, and sixth supply members 112, 114, and 116, the purge gas P may be supplied through the first, third, fifth, and seventh supply members 111, 113, 115, and 117 so as to prevent the first, third, fifth, and seventh supply members 111, 113, 115, and 117 from being contaminated by the second raw material gas R.

Figure 4:
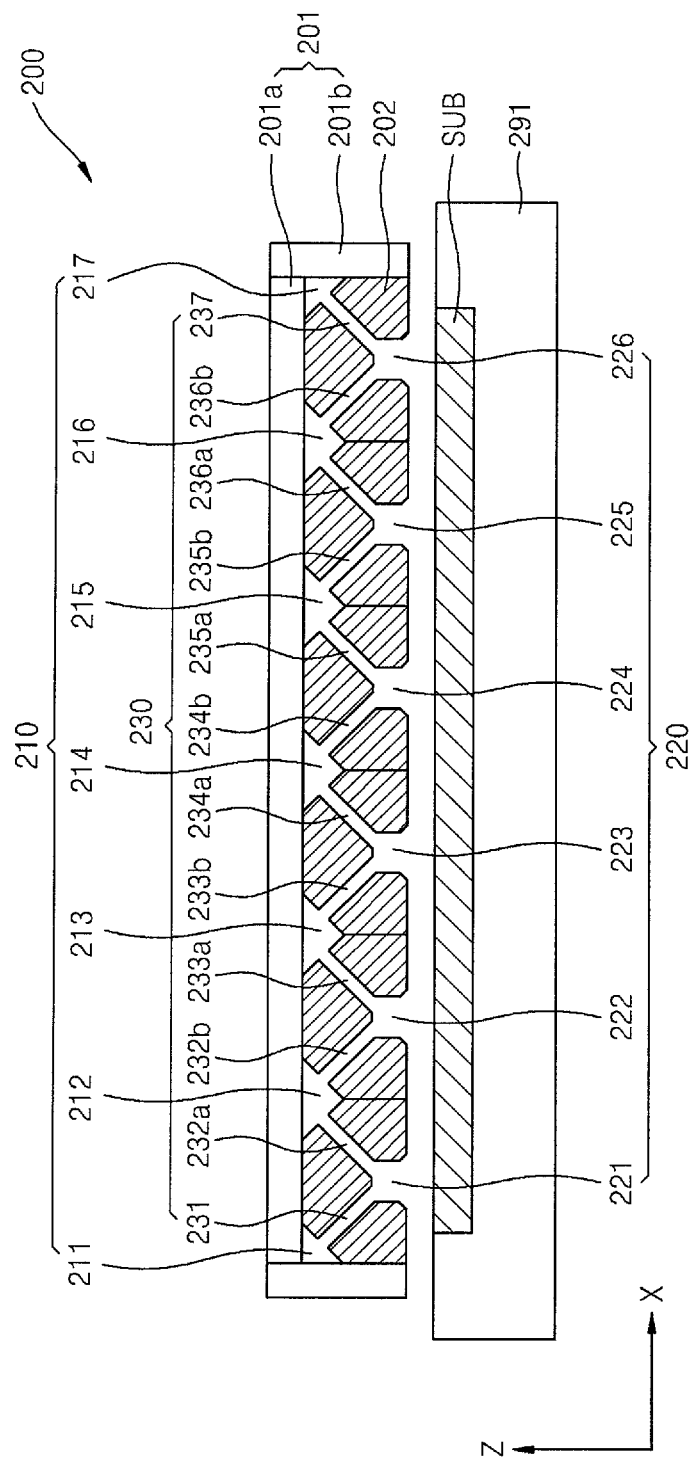
FIG. 4 is a schematic front view of a vapor deposition apparatus according to an other embodiment of the present invention.

FIG. 4 is a front view of a vapor deposition apparatus 200 according to an other embodiment of the present invention. Referring to FIG. 4, the vapor deposition apparatus 200 includes a supply unit 210, a nozzle unit 220, housings 201 and 202, and a stage 291. Differences from the above embodiment will be described for the convenience of description.

A substrate SUB may be disposed on the stage 291. The supply unit 210 may include a plurality of supply members 211 through 217. The plurality of supply members 211 through 217 may have elongated linear shapes. Also, each of the plurality of supply members 211 through 217 may include an end portion and an other end portion. The end portion in each of the supply members 211 through 217 may be connected to a gas supply apparatus to receive one or more gases, and an exhaust unit may be connected to the other end portion.

The nozzle unit 220 is disposed to face the substrate SUB and is closer to the substrate SUB than the supply unit 210 is. The nozzle unit 220 may include a plurality of nozzle members 221 through 226.

The connection unit 230 may be disposed between the supply unit 210 and the nozzle unit 220 and may include a plurality of connection members 231 through 237. The plurality of supply members 211 through 217 and the plurality of nozzle members 221 through 226 may be connected to each other via the plurality of connection members 231 through 237.

The housings 201 and 202 include a first housing 201 and a second housing 202.

The first housing 201 is disposed on an outer portion of the second housing 202. The first housing 201 includes a cover portion 201a and a side portion 201b. The cover portion 201a is disposed on an upper portion of the second housing 202, (e.g., on a surface of the second housing 202 which is opposite to the surface facing the substrate S) and the side portion 201b is disposed at a side surface of the second housing 202.

A space (e.g., a predetermined space) may be formed in the second housing 202 to define the nozzle unit 220 and the connection unit 230 connected to the nozzle unit 220.

The supply unit 210 may be formed between the first housing 201 and the second housing 202. That is, a space (e.g., a predetermined space) may be formed between the cover portion 201a and the second housing 202 and between the side portion 201b and the second housing 202 to define the supply unit 210. For example, recesses (e.g., predetermined recesses) may be formed on the upper surface and the side surface of the second housing 202, and then, the cover portion 201a and the side portion 201b of the first housing 201 may be formed to cover the second housing 202, thereby easily forming the supply unit 210.

Figure 5:
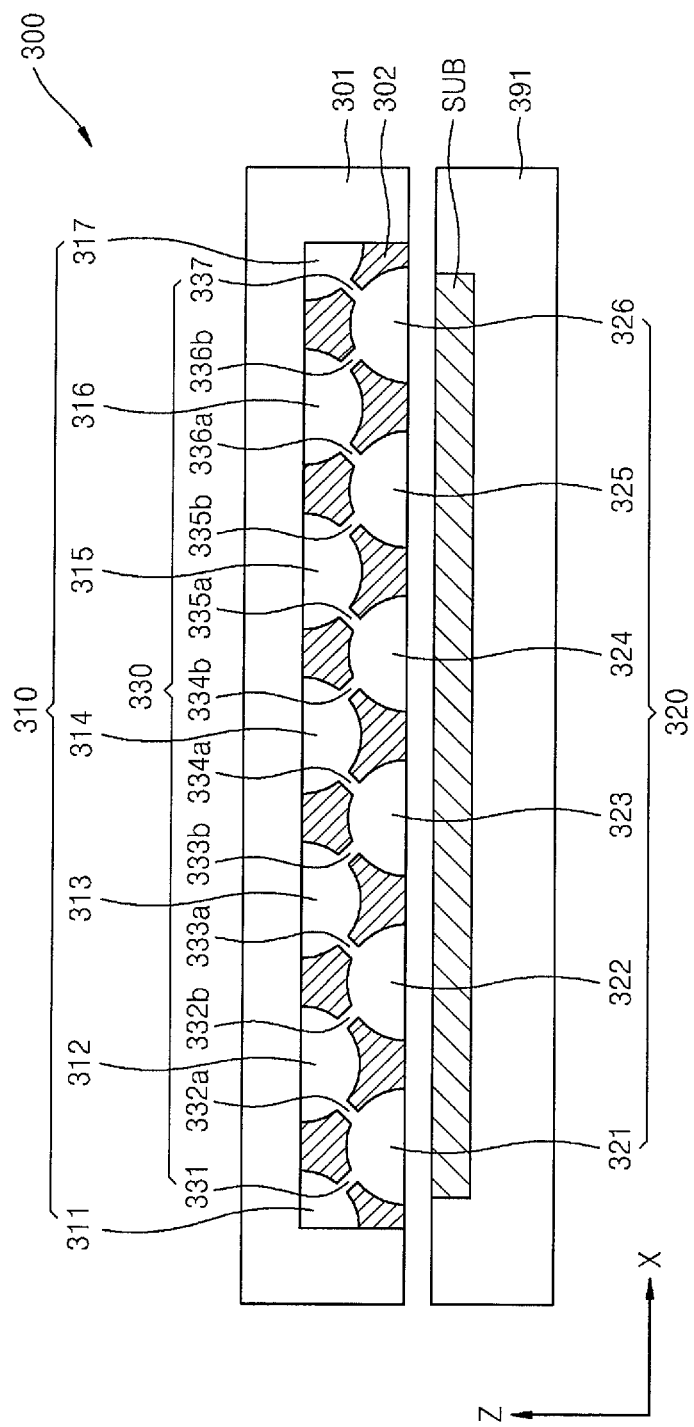
FIG. 5 is a schematic front view of a vapor deposition apparatus according to an other embodiment of the present invention.

FIG. 5 is a front view schematically showing a vapor deposition apparatus 300 according to an other embodiment of the present invention. Referring to FIG. 5, the vapor deposition apparatus 300 includes a supply unit 310, a nozzle unit 320, housings 301 and 302, and a stage 391. Differences from the above embodiments will be described for the convenience of description.

A substrate SUB may be disposed on the stage 391. The supply unit 310 may include a plurality of supply members 311 through 317. The plurality of supply members 311 through 317 may have elongated linear shapes. Also, each of the plurality of supply members 311 through 317 may include an end portion and an other end portion. The end portion in each of the supply members 311 through 317 may be connected to a gas supply apparatus to receive one or more gases, and an exhaust unit may be connected to the other end portion.

The nozzle unit 320 is disposed to face the substrate SUB and is closer to the substrate SUB than the supply unit 310 is. The nozzle unit 320 may include a plurality of nozzle members 321 through 326.

The connection unit 330 is disposed between the supply unit 310 and the nozzle unit 320 and may include a plurality of connection members 331 through 337. The plurality of supply members 311 through 317 and the plurality of nozzle members 321 through 326 may be connected to each other via the plurality of connection members 331 through 337.

The housings 301 and 302 include a first housing 301 and a second housing 302.

The first housing 301 is disposed on an outer portion of the second housing 302.

A space (e.g., a predetermined space) may be formed in the second housing 302 to define the nozzle unit 320 and the connection unit 330 connected to the nozzle unit 320.

Spaces having curved surfaces may be formed in the second housing 302 to form the nozzle unit 320 and the supply unit 310. The plurality of nozzle members 321 through 326 of the nozzle unit 320 may have spaces that are convex upward (e.g., convex as apart from or away from the substrate SUB). The plurality of supply members 311 through 317 of the supply unit 310 may have spaces that are convex downward (e.g., convex toward the substrate SUB). According to the above configuration, lengths of the plurality of connection members 331 through 337 between the supply unit 310 and the nozzle unit 320 may be reduced, thereby improving efficiency in transferring gases from the supply unit 310 to the nozzle unit 320.

Figure 6:
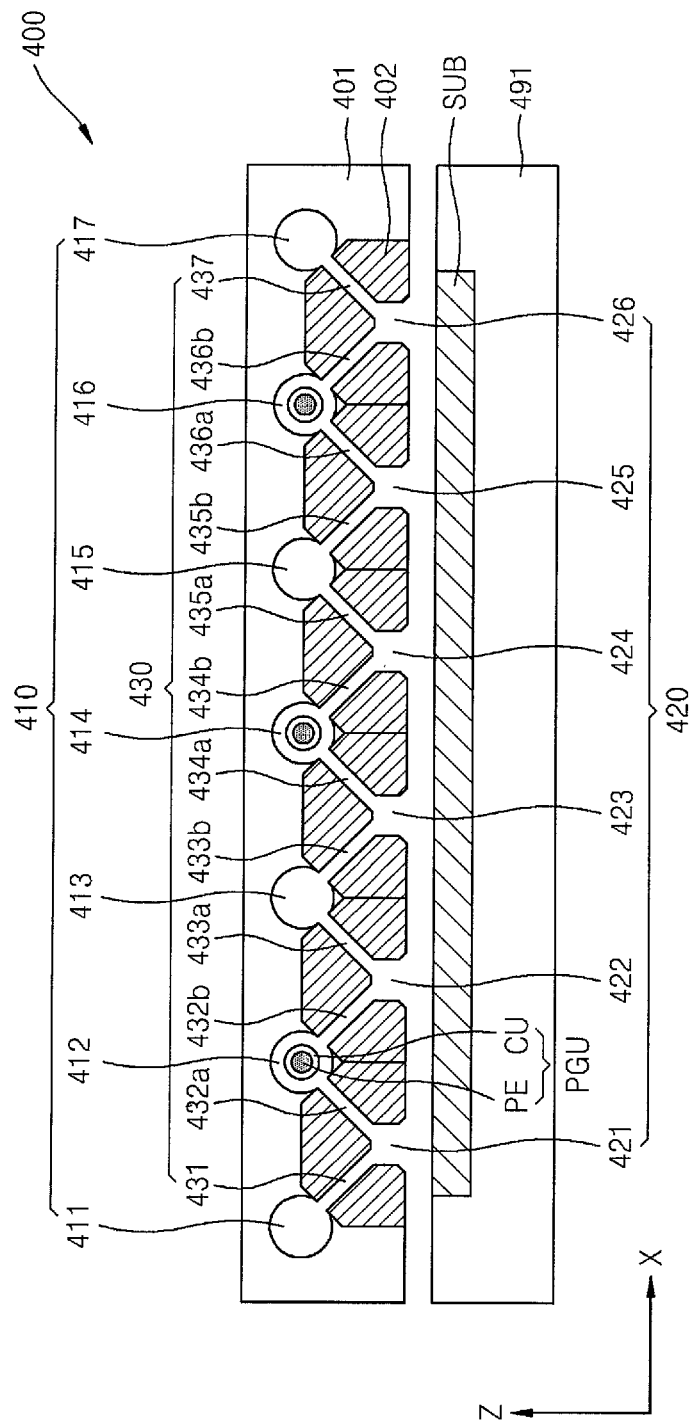
FIG. 6 is a schematic front view of a vapor deposition apparatus according to an other embodiment of the present invention.

FIG. 6 is a front view schematically showing a vapor deposition apparatus 400 according to an other embodiment of the present invention. Referring to FIG. 6, the vapor deposition apparatus 400 includes a supply unit 410, a nozzle unit 420, housings 401 and 402, and a stage 491. Differences from the above embodiments will be described for the convenience of description.

A substrate SUB may be disposed on the stage 491. The supply unit 410 may include a plurality of supply members 411 through 417. The plurality of supply members 411 through 417 may have elongated linear shapes. Also, each of the plurality of supply members 411 through 417 may include an end portion and an other end portion. The end portion in each of the supply members 411 through 417 may be connected to a gas supply apparatus to receive one or more gases, and an exhaust unit may be connected to the other end portion.

The nozzle unit 420 is disposed to face the substrate SUB and is closer to the substrate SUB than the supply unit 410 is. The nozzle unit 420 may include a plurality of nozzle members 421 through 426.

The connection unit 430 is disposed between the supply unit 410 and the nozzle unit 420 and may include a plurality of connection members 431 through 437. The plurality of supply members 411 through 417 and the plurality of nozzle members 421 through 426 are connected to each other via the plurality of connection members 431 through 437.

A plasma generation unit PGU may be disposed on or in at least one supply member of the supply unit 410. The plasma generation unit PGU includes a plasma electrode member PE and a ceramic member CU. The plasma generation units PGU may be disposed on or in, for example, the second, fourth, and sixth supply members 412, 414, and 416. When the second raw material gas R is injected from the second, fourth, and sixth supply members 412, 414, and 416, the second raw material gas R may be converted into radicals by the plasma generation unit PGU and provided onto the substrate SUB, thereby improving deposition efficiency.

Figure 7:
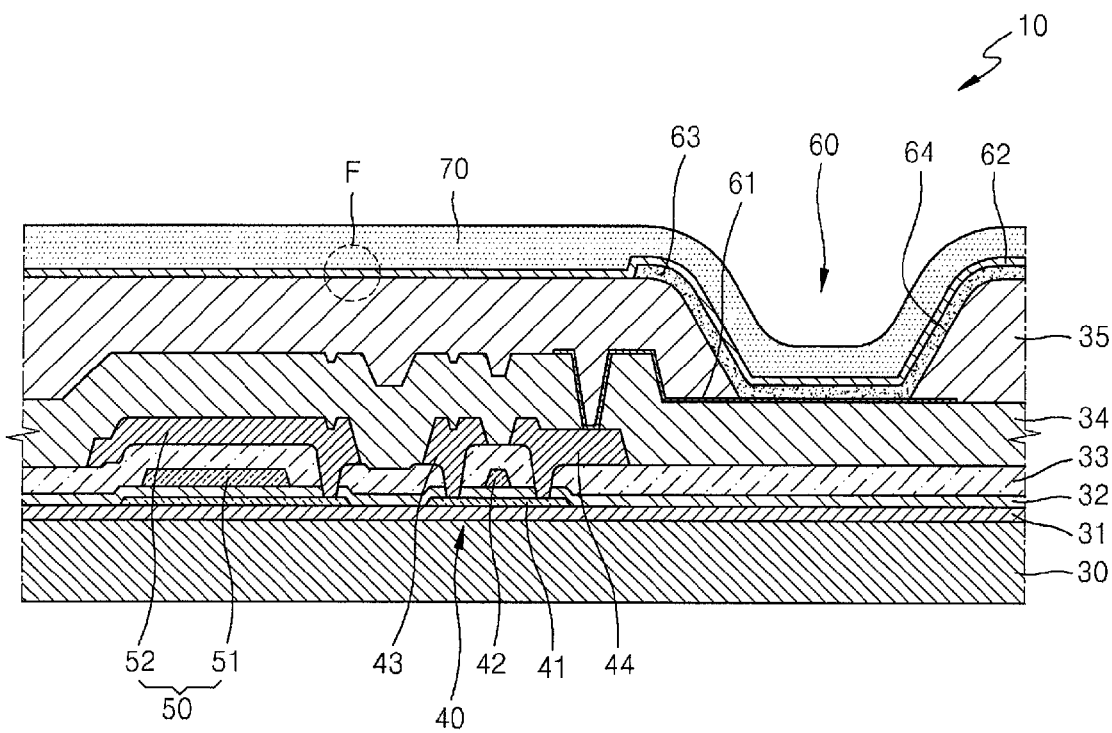
FIG. 7 is a schematic cross-sectional view of an organic light emitting display apparatus manufactured by a method of manufacturing an organic light emitting display apparatus according to an embodiment of the present invention.
Figure 8:
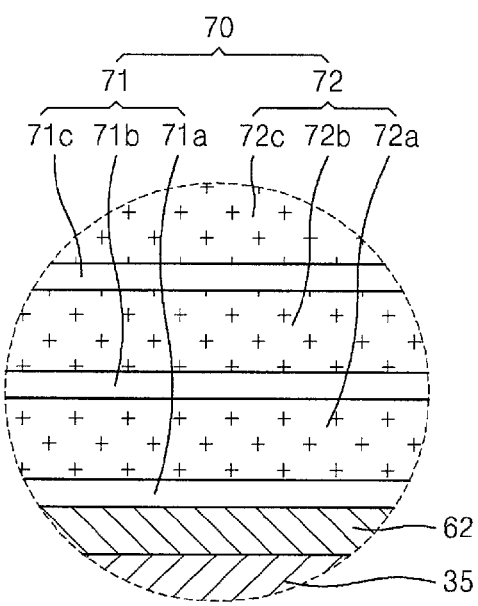
FIG. 8 is an expanded view showing the portion F shown in FIG. 7.

FIG. 7 is a cross-sectional view of an organic light emitting display apparatus 10 manufactured by a method of manufacturing an organic light emitting display apparatus according to an embodiment of the present invention, and FIG. 8 is an expanded view showing the portion F of FIG. 7.

In particular, FIGS. 7 and 8 show an organic light emitting display apparatus manufactured by using one of the above vapor deposition apparatuses 100, 200, 300, and 400.

The organic light emitting display apparatus 10 includes a substrate 30. The substrate 30 may be formed of, for example, a glass material, a plastic material, or a metallic material.

A buffer layer 31 may be formed of an insulating material on the substrate 30 to provide a flat surface on the substrate 30 and prevent or reduce moisture and foreign substances from permeating into or through the substrate 30.

A thin film transistor (TFT) 40, a capacitor 50, and an organic light-emitting device (OLED) 60 may be formed on the buffer layer 31. The TFT 40 includes an active layer 41, a gate electrode 42, a source electrode 43, and a drain electrode 44. The OLED 60 includes a first electrode 61, a second electrode 62, and an intermediate layer 63.

The capacitor 50 includes a first capacitor electrode 51 and a second capacitor electrode 52.

For example, the active layer 41 may be formed in a pattern (e.g., a predetermined pattern) and disposed on an upper surface of the buffer layer 31. The active layer 41 may include an inorganic semiconductor material such as silicon, an organic semiconductor material, or an oxide semiconductor material.

The first capacitor electrode 51 may be formed on the same layer as the gate electrode 42 and may be formed of the same material as that of which the gate electrode 42 is formed.

A gate insulating layer 32 may be formed on the active layer 41. The gate electrode 42 may be formed on the gate insulating layer 32 to correspond to the active layer 41. An interlayer insulating layer 33 may be formed to cover the gate electrode 42, and the source and drain electrodes 43 and 44 may be formed on the interlayer insulating layer 33 to contact an area (e.g., a predetermined area) of the active layer 41. The second capacitor electrode 52 may be formed on the same layer as the source and drain electrodes 43 and 44, and may be formed of the same material as that of which the source and drain electrodes 43 and 44 are formed.

A passivation layer 34 may be formed to cover the source and drain electrodes 43 and 44, and an additional insulating layer may be formed on the passivation layer 34 to planarize the TFT 40.

The first electrode 61 may be formed on the passivation layer 34. The first electrode 61 may be formed to be electrically connected to one of the source and drain electrodes 43 and 44. A pixel defining layer 35 may be formed to cover the first electrode 61. An opening 64 (e.g., a predetermined opening) may be formed in the pixel defining layer 35, and the intermediate layer 63, including an organic emission layer, may be formed in an area defined by the opening 64. The second electrode 62 may be formed on the intermediate layer 63.

An encapsulation layer 70 may be formed on the second electrode 62. The encapsulation layer 70 may include an organic material or an inorganic material and may have a structure in which an organic material and an inorganic material are stacked (e.g., alternately stacked).

The encapsulation layer 70 may be formed by using one of the vapor deposition apparatuses described above. In other words, the substrate 30, on which the second electrode 62 has been formed, passes through one of the vapor deposition apparatuses described above so that a desired layer or layers may be formed thereon.

For example, the encapsulation layer 70 may include one or more inorganic layers 71. When forming the one or more inorganic layers 71, the vapor deposition apparatus described above may be used.

In one example embodiment, as shown in FIG. 8, the encapsulation layer 70 includes the inorganic layer 71 and the organic layer 72, and the inorganic layer 71 includes a plurality of layers 71a, 71b, and 71c and the organic layer 72 includes a plurality of layers 72a, 72b, and 72c. Here, the plurality of layers 71a, 71b, and 71c of the inorganic layer 71 may be formed by using the vapor deposition apparatus described above.

However, the embodiments of the present invention are not limited thereto. In other words, other insulating layers, such as the buffer layer 31, the gate insulating layer 32, the interlayer insulating layer 33, the passivation layer 34, the pixel defining layer 35, etc. of the organic light emitting display apparatus 10, may be formed by using the vapor deposition apparatus of the embodiment of the present invention.

Other thin films, such as the active layer 41, the gate electrode 42, the source and drain electrodes 43 and 44, the first electrode 61, the intermediate layer 63, the second electrode 62, etc., may also be formed by using the vapor deposition apparatus of the embodiments of the present invention.

As described above, when the vapor deposition apparatus according to the embodiments of the present invention is used to form a deposition layer of the organic light emitting display apparatus 10, the characteristics of the organic light emitting display 10 may be improved, and accordingly, electric properties and image quality of the organic light emitting display apparatus 10 may be improved.

As described above, according to the one or more of the above embodiments of the present invention, the processing efficiency of a vapor deposition process and the properties of a TFT may be easily improved.

It should be understood that the example embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A vapor deposition apparatus for depositing thin films on a substrate, the vapor deposition apparatus comprising:
   a supply unit comprising a plurality of linear supply members configured to supply at least one gas; and
   a nozzle unit comprising a plurality of nozzle members connected to the plurality of supply members and configured to supply the at least one gas toward the substrate,
   wherein two supply members of the plurality of supply members are connected to at least one common nozzle member of the plurality of nozzle members.

2. The vapor deposition apparatus of claim 1, wherein the plurality of nozzle members of the nozzle unit are elongated along a direction parallel to a direction along which the supply members extend.

3. The vapor deposition apparatus of claim 1, wherein the plurality of supply members comprise first supply members, selectively supplying a purge gas and a first raw material gas, and second supply members, selectively supplying the purge gas and a second raw material gas.

4. The vapor deposition apparatus of claim 3, wherein the first supply members, selectively supplying the purge gas and the first raw material gas, and the second supply members, selectively supplying the purge gas and the second raw material gas, are alternately located.

5. The vapor deposition apparatus of claim 3, wherein when the first supply members, selectively supplying the purge gas and the first raw material gas, supply the first raw material gas, the second supply members, selectively supplying the purge gas and the second raw material gas, supply the purge gas.

6. The vapor deposition apparatus of claim 3, wherein when the second supply members, selectively supplying the purge gas and the second raw material gas, supply the second raw material gas, the first supply members, selectively supplying the purge gas and the first raw material gas, supply the purge gas.

7. The vapor deposition apparatus of claim 1, wherein the two supply members that are connected to the at least one common nozzle member are adjacent to each other.

8. The vapor deposition apparatus of claim 1, wherein two adjacent nozzle members of the plurality of nozzle members are connected to at least one common supply member of the plurality of supply members.

9. A vapor deposition method comprising:
preparing a substrate;
supplying a gas to a supply unit, wherein the gas is supplied to one end portion of each of a plurality of linear supply members of the supply unit;
transferring the gas supplied to the supply unit to a nozzle unit comprising a plurality of nozzle members; and
providing the gas toward the substrate via the nozzle members,
wherein two supply members of the plurality of supply members are connected to at least one common nozzle member of the plurality of nozzle members.

10. The vapor deposition method of claim 9, wherein the plurality of nozzle members of the nozzle unit are elongated along a direction parallel to a direction along which the supply members extend.

11. The vapor deposition method of claim 9, wherein the plurality of supply members comprise first supply members, selectively supplying a purge gas and a first raw material gas, and second supply members, selectively supplying the purge gas and a second raw material gas.

12. The vapor deposition method of claim 11, wherein the first supply members, selectively supplying the purge gas and the first raw material gas, and the second supply members, selectively supplying the purge gas and the second raw material gas, are alternately located.

13. The vapor deposition method of claim 11, wherein when the first supply members, selectively supplying the purge gas and the first raw material gas, supply the first raw material gas, the second supply members, selectively supplying the purge gas and the second raw material gas, supply the purge gas.

14. The vapor deposition method of claim 11, wherein when the second supply members, selectively supplying the purge gas and the second raw material gas, supply the second raw material gas, the first supply members, selectively supplying the purge gas and the first raw material gas, supply the purge gas.

15. The vapor deposition method of claim 9, wherein the two supply members that are connected to the at least one common nozzle member are adjacent to each other.

16. The vapor deposition method of claim 9, wherein an exhaust unit is connected to an other end portion facing the one end portion of each of the plurality of linear supply members.

17. The vapor deposition method of claim 9, wherein the vapor deposition method comprises an atomic layer deposition (ALD) method.

18. The vapor deposition method of claim 9, wherein two adjacent nozzle members of the plurality of nozzle members are arranged so as to be connected to at least one common supply member of the plurality of supply members.

19. A method of manufacturing an organic light emitting display apparatus comprising one or more thin films on a substrate, the method comprising processes of forming the one or more thin films on the substrate and comprising:
preparing a substrate;
supplying a gas to a supply unit, wherein the gas is supplied to one end portion of each of a plurality of linear supply members of the supply unit;
transferring the gas supplied to the supply unit to a nozzle unit comprising a plurality of nozzle members; and
providing the gas toward the substrate via the nozzle members,
wherein two supply members of the plurality of supply members are connected to at least one common nozzle member of the plurality of nozzle members.

20. The method of claim 19, wherein the organic light emitting display apparatus comprises an organic light emitting device (OLED) comprising a first electrode, a second electrode, and an intermediate layer between the first electrode and the second electrode, the intermediate layer comprising at least an organic emission layer, and
wherein the forming the one or more thin films on the substrate further comprises forming an encapsulation layer on the OLED.

21. The method of claim 19, wherein the forming the one or more thin films on the substrate further comprises forming one or more insulating layers in the organic light emitting display apparatus.

22. The method of claim 19, wherein the forming the one or more thin films on the substrate further comprises forming one or more conductive layers in the organic light emitting display apparatus.

23. The method of claim 19, wherein two adjacent nozzle members of the plurality of nozzle members are arranged so as to be connected to at least one common supply member of the plurality of supply members.

* * * * *